United States Patent
Kim et al.

(10) Patent No.: US 11,081,676 B2
(45) Date of Patent: Aug. 3, 2021

(54) DISPLAY APPARATUS

(71) Applicant: Samsung Display Co., Ltd., Yongin-si (KR)

(72) Inventors: Woongsik Kim, Yongin-si (KR); Jinsu Byun, Yongin-si (KR); Sanghyun Lee, Yongin-si (KR); Gwangmin Cha, Yongin-si (KR); Saehee Han, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 16/844,561

(22) Filed: Apr. 9, 2020

(65) Prior Publication Data

US 2021/0013452 A1    Jan. 14, 2021

(30) Foreign Application Priority Data

Jul. 11, 2019 (KR) .................. 10-2019-0084055

(51) Int. Cl.
*G06F 3/044* (2006.01)
*H01L 51/52* (2006.01)
*H01L 27/32* (2006.01)

(52) U.S. Cl.
CPC ........ *H01L 51/5275* (2013.01); *G06F 3/0446* (2019.05); *H01L 27/323* (2013.01); *H01L 27/3246* (2013.01); *H01L 51/5253* (2013.01)

(58) Field of Classification Search
CPC ......... G06F 2203/04112; G06F 3/0412; G06F 3/0446; H01L 27/323; H01L 27/3246; H01L 51/5253; H01L 51/5256; H01L 51/5275

USPC .......................................... 1/1; 345/170–178
See application file for complete search history.

(56) References Cited

U.S. PATENT DOCUMENTS

| | | | |
|---|---|---|---|
| 6,072,450 | A | 6/2000 | Yamada et al. |
| 7,535,646 | B2 | 5/2009 | Chari et al. |
| 8,687,273 | B2 | 4/2014 | Fukushima et al. |
| 8,823,254 | B2 | 9/2014 | Ohta et al. |
| 8,901,587 | B2 | 12/2014 | Ohta |
| 9,142,802 | B2 | 9/2015 | Miyamoto et al. |
| 9,368,757 | B2 | 6/2016 | Choi et al. |

(Continued)

FOREIGN PATENT DOCUMENTS

| | | |
|---|---|---|
| JP | 2009-110873 | 5/2009 |
| JP | 4933553 | 5/2012 |

(Continued)

*Primary Examiner* — Tony O Davis
(74) *Attorney, Agent, or Firm* — Kile Park Reed & Houtteman PLLC

(57) ABSTRACT

A display apparatus may include a substrate, a display element disposed above the substrate, an encapsulation layer disposed above the display element and including an inorganic encapsulation layer and an organic encapsulation layer, and a touch-sensing layer disposed above the encapsulation layer. The touch-sensing layer may include a first insulating layer including a side surface inclined with respect to a top surface of the encapsulation layer and including an organic material. The touch-sensing layer may include a conductive layer including sensing electrodes, and a second insulating layer covering the conductive layer and including a refractive index that may be different from that of the first insulating layer.

22 Claims, 14 Drawing Sheets

(56) References Cited

U.S. PATENT DOCUMENTS

| | | | |
|---|---|---|---|
| 10,224,377 B2 | 3/2019 | Park et al. | |
| 10,338,449 B2 | 7/2019 | Kang et al. | |
| 2012/0104368 A1 | 5/2012 | Isobe et al. | |
| 2014/0339509 A1 | 11/2014 | Choi et al. | |
| 2015/0333108 A1 | 11/2015 | Miyamoto et al. | |
| 2016/0043145 A1 | 2/2016 | Choi et al. | |
| 2016/0064694 A1 | 3/2016 | Choi et al. | |
| 2018/0012940 A1 | 1/2018 | Park et al. | |
| 2018/0033830 A1 | 2/2018 | Kim et al. | |
| 2018/0308903 A1* | 10/2018 | Jeong | H01L 27/3276 |
| 2019/0013495 A1 | 1/2019 | Kim et al. | |
| 2019/0051708 A1* | 2/2019 | Jeong | H01L 51/5281 |
| 2019/0051711 A1* | 2/2019 | Lee | H01L 27/3246 |
| 2019/0115395 A1* | 4/2019 | Lee | G06F 3/0346 |
| 2019/0165061 A1* | 5/2019 | Jung | H01L 27/323 |
| 2019/0198782 A1 | 6/2019 | Kim et al. | |
| 2019/0221778 A1 | 7/2019 | Kim et al. | |
| 2019/0244000 A1* | 8/2019 | Son | G06K 9/00 |
| 2020/0357856 A1* | 11/2020 | Koo | H01L 27/323 |

FOREIGN PATENT DOCUMENTS

| | | |
|---|---|---|
| JP | 2012-109214 | 6/2012 |
| JP | 5373054 | 12/2013 |
| JP | 5523354 | 6/2014 |
| KR | 10-2013-0008660 | 1/2013 |
| KR | 10-2014-0135568 | 11/2014 |
| KR | 10-2014-0143916 | 12/2014 |
| KR | 10-2018-0005323 | 1/2018 |
| KR | 10-2018-0005327 | 1/2018 |
| KR | 10-2018-0014398 | 2/2018 |
| KR | 10-2018-0059010 | 6/2018 |
| KR | 10-2019-0004863 | 1/2019 |
| KR | 10-2019-0087689 | 7/2019 |

* cited by examiner

DISPLAY APPARATUS

CROSS-REFERENCE TO RELATED APPLICATION

This application claims priority to and the benefits of Korean Patent Application No. 10-2019-0084055 under 35 U.S.C. § 119, filed in the Korean Intellectual Property Office on Jul. 11, 2019, the entire contents of which are incorporated herein by reference.

BACKGROUND

1. Technical Field

One or more embodiments relate to a display apparatus having a structure enabling improved light emission.

2. Description of Related Art

Display apparatuses have been used for various purposes. As display apparatuses become thinner and lighter, the display apparatuses tend to be widely used. As display apparatuses are utilized in various fields, there is an increasing demand for display apparatuses capable of providing high quality images.

It is to be understood that this background of the technology section is, in part, intended to provide useful background for understanding the technology. However, this background of the technology section (and other sections) may also include ideas, concepts, or recognitions that were not part of what was known or appreciated by those skilled in the pertinent art prior to a corresponding effective filing date of the subject matter disclosed herein.

SUMMARY

In order to provide an image, a display apparatus may include display elements that may emit color light. Elements or layers may be disposed on the display elements so as to protect the display elements or add a function to the display apparatus. The efficiency of light emitted from each display element by the elements or layers on the display elements may be deteriorated.

The disclosure has been made in an effort to solve various problems including the above-described problem, and provides a display apparatus capable of providing high quality images. However, these problems are merely examples, and the scope of the disclosure is not limited thereto.

Additional aspects will be set forth in part in the description which follows and, in part, will be apparent from the description, or may be learned by practice of the presented embodiments of the disclosure.

According to one or more embodiments, a display apparatus may include a substrate, a display element disposed above the substrate, an encapsulation layer disposed above the display element and including an inorganic encapsulation layer and an organic encapsulation layer, and a touch-sensing layer disposed above the encapsulation layer. The touch-sensing layer may include a first insulating layer including a side surface inclined with respect to a top surface of the encapsulation layer and including an organic material. The touch-sensing layer may include a conductive layer including sensing electrodes, and a second insulating layer covering the conductive layer and including a refractive index that may be different from that of the first insulating layer.

At least a portion of the first insulating layer may contact the top surface of the encapsulation layer.

The encapsulation layer may include a first inorganic encapsulation layer, an organic encapsulation layer, and a second inorganic encapsulation layer. The first inorganic encapsulation layer, the organic encapsulation layer, and the second inorganic encapsulation layer may be stacked on each other. A portion of the first insulating layer may contact the second inorganic encapsulation layer.

The first insulating layer may include a photoresist.

The first insulating layer may include a first opening defined by the side surface thereof and overlapping an emission area of the display element. The second insulating layer may at least partially fill the first opening of the first insulating layer.

A refractive index of the second insulating layer may be greater than a refractive index of the first insulating layer.

The display element may include a pixel electrode, a pixel defining layer that may cover an edge of the pixel electrode and include a second opening overlapping the pixel electrode, an emission layer that may be disposed at the second opening, and an opposite electrode that may cover the emission layer. A body portion of the first insulating layer may overlap the pixel defining layer.

A width of the first opening of the first insulating layer may be greater than a width of the second opening of the pixel defining layer.

The first insulating layer may overlap an emission area of the display element and may have a width greater than that of the emission area.

The side surface of the first insulating layer may include an inclined surface reverse-tapered in a direction away from the encapsulation layer.

The display element may include, a pixel electrode, a pixel defining layer that may cover an edge of the pixel electrode and include a second opening that may overlap the pixel electrode, an emission layer that may overlap the second opening, and an opposite electrode that may cover the emission layer. A central portion of the first insulating layer may overlap the second opening of the pixel defining layer, and a periphery portion of the first insulating layer overlaps the pixel defining layer.

A refractive index of the first insulating layer may be greater than a refractive index of the second insulating layer.

According to one or more embodiments, a display apparatus may include a substrate, a pixel electrode that may be disposed above the substrate, and a pixel defining layer that may include an opening overlapping the pixel electrode and define an emission area. The display apparatus may include an emission layer that may be disposed in the opening, an opposite electrode that may be disposed above the emission layer, an encapsulation layer that may be disposed above the opposite electrode and include an inorganic encapsulation layer and an organic encapsulation layer, a conductive layer that may be disposed above the encapsulation layer and include a sensing electrode, a first organic insulating layer that may include a side surface inclined with respect to a top surface of the encapsulation layer, and a second organic insulating layer that may cover the first organic insulating layer and the conductive layer and include a refractive index different from that of the first organic insulating layer.

The first organic insulating layer may include a photoresist.

The encapsulation layer may include a first inorganic encapsulation layer, an organic encapsulation layer, and a second inorganic encapsulation layer. The first inorganic encapsulation layer, the organic encapsulation layer, and the second inorganic encapsulation layer may be stacked on each other. A portion of the first organic insulating layer may contact the second inorganic encapsulation layer.

The first organic insulating layer may include, a first opening overlapping the opening of the pixel defining layer, and a body portion overlapping a body portion of the pixel defining layer.

A width of the first opening of the first organic insulating layer may be greater than a width of the opening of the pixel defining layer.

The second organic insulating layer may at least partially fill the first opening, and a refractive index of the second organic insulating layer may be greater than a refractive index of the first organic insulating layer.

The first organic insulating layer may include a body portion that may overlap the opening of the pixel defining layer, the side surface of the first organic insulating layer may include an inclined surface reverse-tapered in a direction away from the encapsulation layer, and a refractive index of the second organic insulating layer may be less than a refractive index of the first organic insulating layer.

A periphery portion of the first organic insulating layer may overlap a portion of a body portion of the pixel defining layer.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION OF THE EMBODIMENTS

Figure 1:
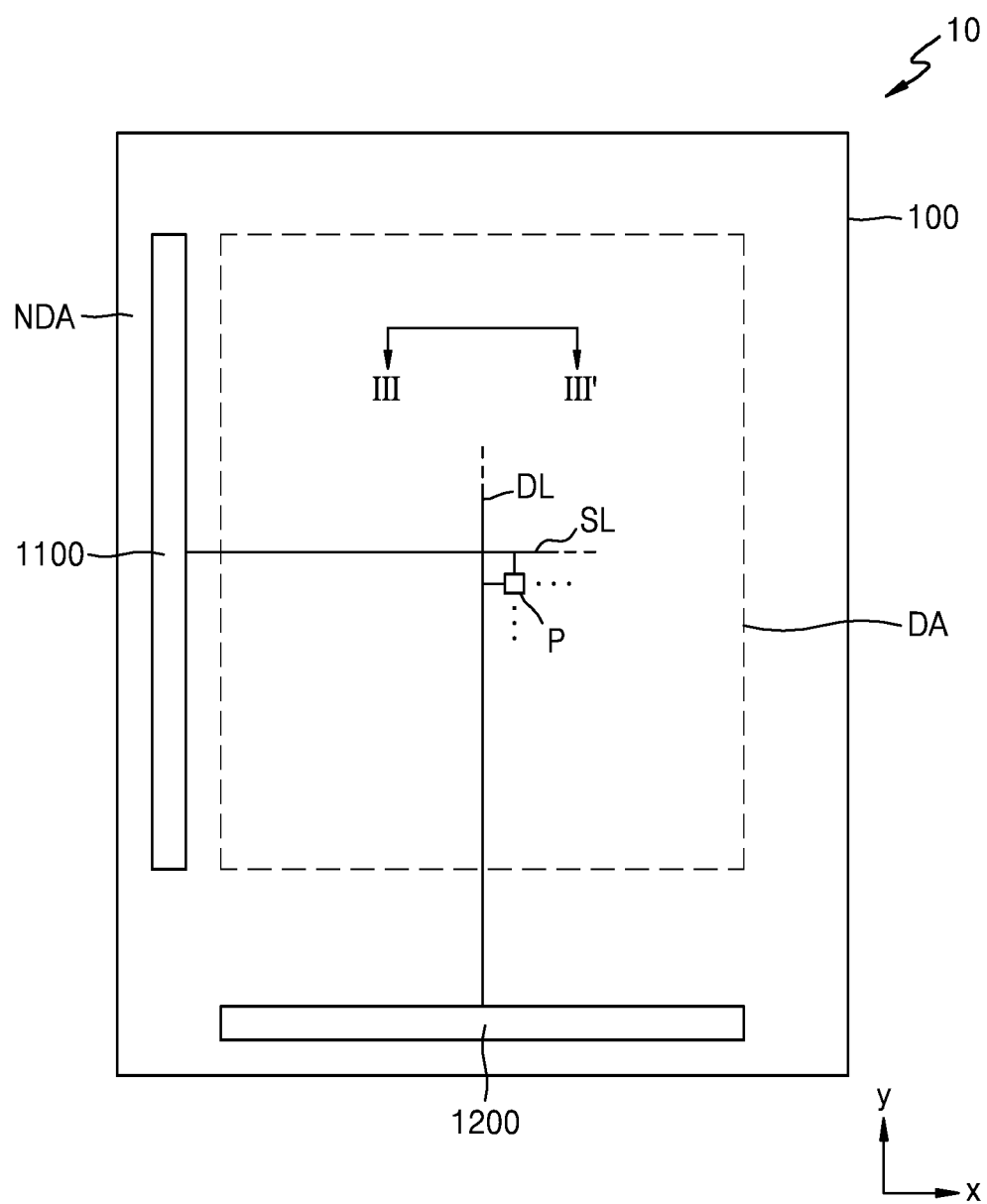
FIG. 1 is a plan view schematically illustrating a display apparatus according to an embodiment.

Reference will now be made to embodiments illustrated in the accompanying drawings, wherein like reference numerals refer to like elements throughout. In this regard, the embodiments may have different forms and should not be construed as being limited to the descriptions set forth herein. As used herein, the term "and/or" includes any and all combinations of one or more of the associated listed items. The terms "and" and "or" may be used in the conjunctive or disjunctive sense and may be understood to be equivalent to "and/or". Expressions such as "at least one of," when preceding a list of elements, modify the entire list of elements and do not modify the individual elements of the list.

In the following embodiments, it will be understood that the terms "first," "second," etc. are only used to distinguish one component from another rather than to limit meaning.

In the following embodiments, the singular forms "a," "an," and "the" may be intended to include the plural forms as well, unless the context clearly indicates otherwise.

In the following embodiments, it will also be understood that the terms "comprises," "includes," and "has," when used herein, specify the presence of stated elements, but do not preclude the presence or addition of other elements, unless otherwise defined.

In the following embodiments, it will be understood that when a film, region, or component is described as being "formed on", "covering", etc. another layer, region, or component, it may be directly or indirectly formed on, covering, etc. the other layer, region, or component. For example, intervening films, regions, or components may be present.

Sizes of components in the drawings may be exaggerated for convenience of explanation. For example, because sizes and thicknesses of components in the drawings may be arbitrarily illustrated for convenience of explanation, the following embodiments are not limited thereto.

When a certain embodiment may be implemented differently, a specific process order may be performed differently from the described order. For example, two consecutively described processes may be performed substantially at the same time or performed in an order opposite to the described order.

In the following embodiments, it will be understood that when a film, layer, region, element, or component is referred to as being "connected to" or "coupled to" another film, layer, region, element, and component, it may be directly or indirectly connected or coupled to the other film, layer, region, element, or component. That is, for example, intervening films, regions, or components may be present. In the following embodiments, it will be understood that when a film, layer, region, element, or component is referred to as being "electrically connected to" or "electrically coupled to" another film, layer, region, element, and component, it may be directly or indirectly electrically connected or coupled to the other film, layer, region, element, or component. That is, for example, intervening films, layers, regions, elements, or components may be present.

In the following examples, the x-axis, the y-axis and the z-axis are not limited to three axes of the rectangular coordinate system, and may be interpreted in a broader sense. For example, the x-axis, the y-axis, and the z-axis may be perpendicular to one another, or may represent different directions that are not perpendicular to one another.

In this specification, "A and/or B" refers to A, B, or A and B. The term "overlap" may include layer, stack, face or facing, extending over, covering or partly covering or any other suitable term as would be appreciated and understood by those of ordinary skill in the art.

The spatially relative terms "below", "beneath", "lower", "above", "upper", "over", or the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, in the case where a device illustrated in the drawing is turned over, the device positioned "below" or "beneath" another device may be placed "above" or "over" another device. Accordingly, the illustrative term "below" may include both the lower and upper positions. The device may also be oriented in other directions and thus the spatially relative terms may be interpreted differently depending on the orientations.

Unless otherwise defined, all terms used herein (including technical and scientific terms) have the same meaning as commonly understood by those skilled in the art to which this invention pertains. It will be further understood that terms, such as those defined in commonly used dictionaries, should be interpreted as having a meaning that is consistent with their meaning in the context of the relevant art and will not be interpreted in an ideal or excessively formal sense unless clearly defined in the description.

FIG. 1 is a plan view schematically illustrating a display apparatus 10 according to an embodiment.

Referring to FIG. 1, the display apparatus 10 may include a display area DA and a non-display area NDA adjacent to the display area DA. The non-display area NDA may surround the display area DA.

The display apparatus 10 may include pixels P disposed in the display area DA. Each of the pixels P may include a display element capable of emitting color light. The display element may be electrically connected to a scan line SL and a data line DL. FIG. 1 illustrates a substrate 100 in the display apparatus 10 having one possible configuration. For example, the substrate 100 may include the display area DA and the non-display area NDA. As another example, the substrate 100 may include a first area corresponding to the display area DA and a second area corresponding to the non-display area NDA.

A scan driver 1100, a data driver 1200, and first and second main power lines (not shown in FIG. 1) may be disposed in the non-display area NDA. The scan driver 1100 may be configured to provide a scan signal to each of the pixels P through a respective scan line SL. The data driver 1200 may be configured to provide a data signal to the display element included in each of the pixels P through a respective data line DL. First and second main power lines may be configured to provide first and second power supply voltages.

FIG. 1 illustrates an example in which the data driver 1200 may be disposed above the substrate 100, but as another embodiment, the data driver 1200 may be disposed above a flexible printed circuit board (FPCB) electrically connected to a pad disposed at one side of the display apparatus 10.

Examples of the display apparatus 10 according to an embodiment may include an organic light-emitting display, an inorganic electroluminescence (EL) display (inorganic light-emitting display), a quantum dot display, and/or a liquid crystal display. Hereinafter, an organic light-emitting display apparatus will be described as an example of the display apparatus according to an embodiment, but the display apparatus is not limited thereto. The features described below may be applied to various types of display apparatuses as described above.

Figure 2:
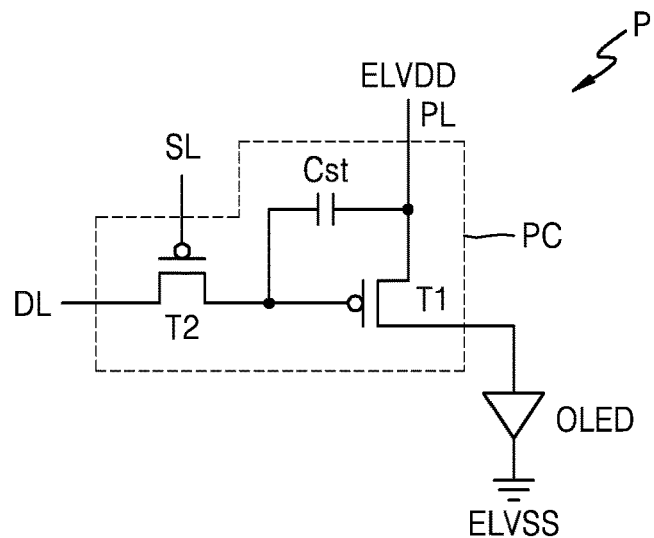
FIG. 2 illustrates a display element included in a pixel of the display apparatus of FIG. 1 and a pixel circuit connected thereto, according to an embodiment.

FIG. 2 illustrates a display element that may be included in one pixel of a display apparatus and a pixel circuit that may be electrically connected thereto, according to an embodiment.

Referring to FIG. 2, an organic light-emitting diode (OLED), which is a display element, may be electrically connected to a pixel circuit PC. The pixel circuit PC may include a first thin film transistor (TFT) T1, a second TFT T2, and a storage capacitor Cst. The OLED may emit, for example, red, green, or blue light. In other embodiments, the OLED may emit red, green, blue, or white light.

The second TFT T2 may be a switching TFT. The second TFT T2 may be electrically connected to the scan line SL and the data line DL and may transfer a data voltage that may be applied from the data line DL to the first TFT T1 in response to a switching voltage applied from the scan line SL. The storage capacitor Cst may be electrically connected to the second TFT T2 and a driving voltage line PL and may store a voltage corresponding to a difference between a voltage transferred from the second TFT T2 and a first power supply voltage ELVDD supplied to the driving voltage line PL.

The first TFT T1 may be a driving TFT. The first TFT T1 may be electrically connected to the storage capacitor Cst and may control a driving current flowing from the driving voltage line PL to the OLED in response to a voltage value stored in the storage capacitor Cst. The OLED may emit light having a luminance by a driving current. An opposite electrode (for example, a cathode) of the OLED may receive a second power supply voltage ELVSS.

FIG. 2 illustrates an example in which the pixel circuit PC may include two TFTs and one storage capacitor, but in another embodiment, the number of TFTs or the number of storage capacitors may be variously changed according to the design of the pixel circuit PC.

Figure 3:
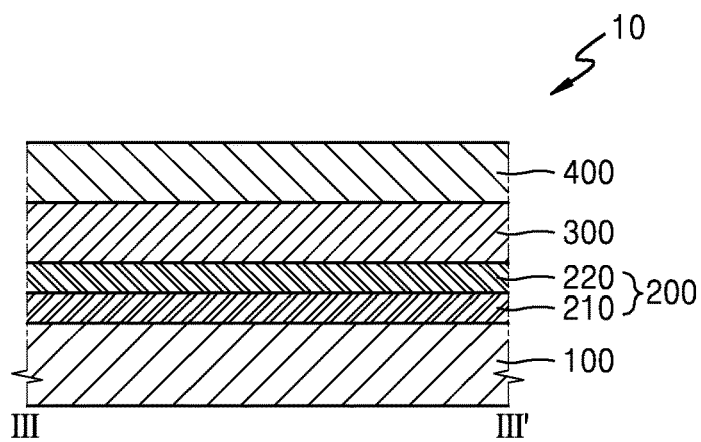
FIG. 3 is a cross-sectional view schematically illustrating a display apparatus according to an embodiment.

FIG. 3 is a cross-sectional view schematically illustrating the display apparatus 10 of FIG. 1 and corresponds to a cross section taken along line III-III' of FIG. 1.

Referring to FIG. 3, a display layer 200 may be disposed above the substrate 100, and an encapsulation layer 300 and a functional layer 400 may be disposed above the display layer 200.

The substrate 100 may include a polymer resin or a glass material. In a case that the substrate 100 includes the polymer resin, the substrate 100 may have flexible, rollable, or bendable characteristics. The display layer 200 may include a display element layer 220 including display elements, and a pixel circuit layer 210 including pixel circuits, respectively. The pixel circuits may be electrically connected to the display elements. Each of the display elements included in the display element layer 220 may define a pixel, and the pixel circuit layer 210 may include transistors and storage capacitors.

The encapsulation layer 300 may be disposed above the display layer 200. The encapsulation layer 300 may prevent the display elements from being damaged by external foreign substances such as moisture. The encapsulation layer 300 may include at least one inorganic encapsulation layer and at least one organic encapsulation layer.

The functional layer 400 may be disposed above the encapsulation layer 300. The functional layer 400 may be a touch-sensing layer that senses a touch input, and insulating layers included in the functional layer 400 may include a structure that improves light emission efficiency of light emitted from the display elements. The touch input may be performed by a finger, a stylus pen, or the like. For example, the functional layer 400 may be a touch-sensing layer capable of sensing a touch input and an optical layer capable of improving optical performance. The functional layer 400 may include sensing electrodes so as to sense a touch input and may include two layers having different refractive indices so as to improve optical performance.

Figure 4:
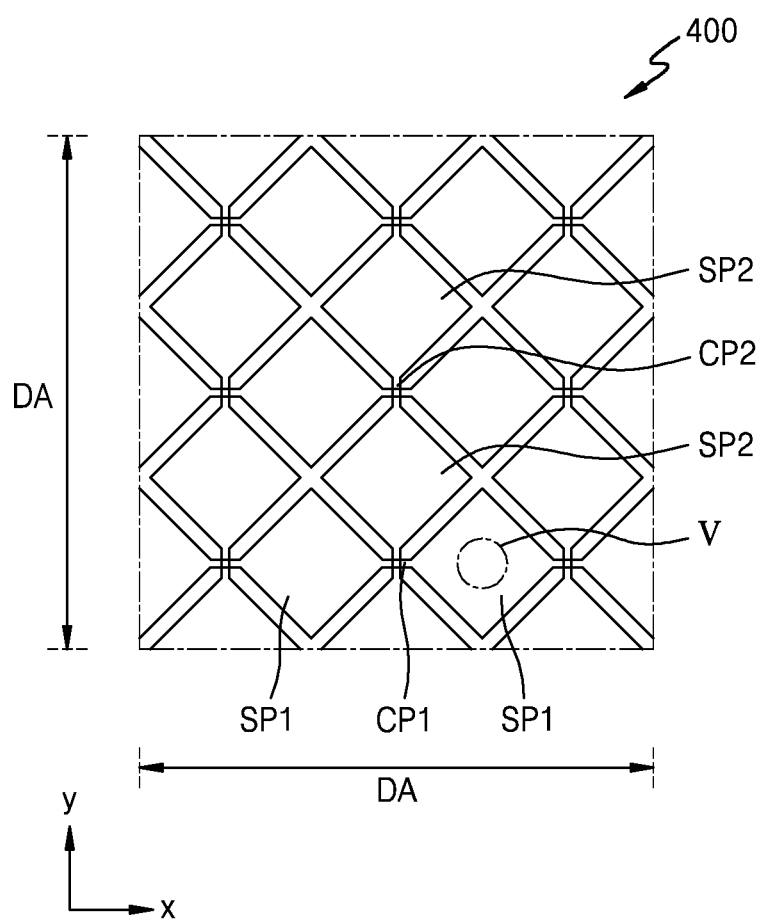
FIG. 4 is a plan view of a functional layer according to an embodiment, which schematically illustrates touch electrodes included in the functional layer.
Figure 5A:
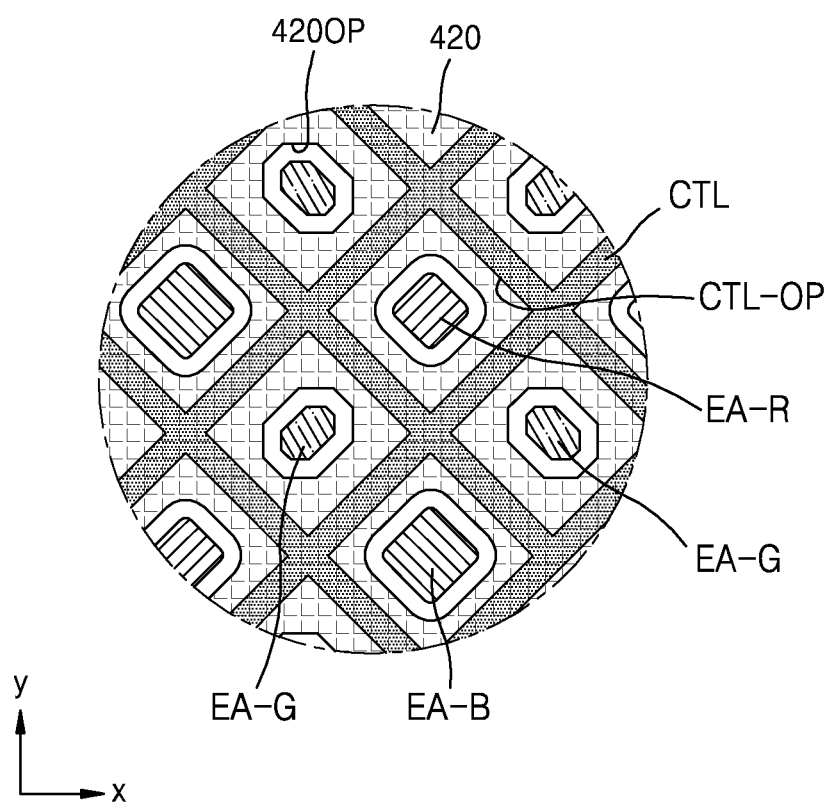
FIGS. 5A and 5B are plan views of the functional layer of FIG. 4 according to embodiments, which show an enlarged plan view of portion V of FIG. 4.
Figure 5B:
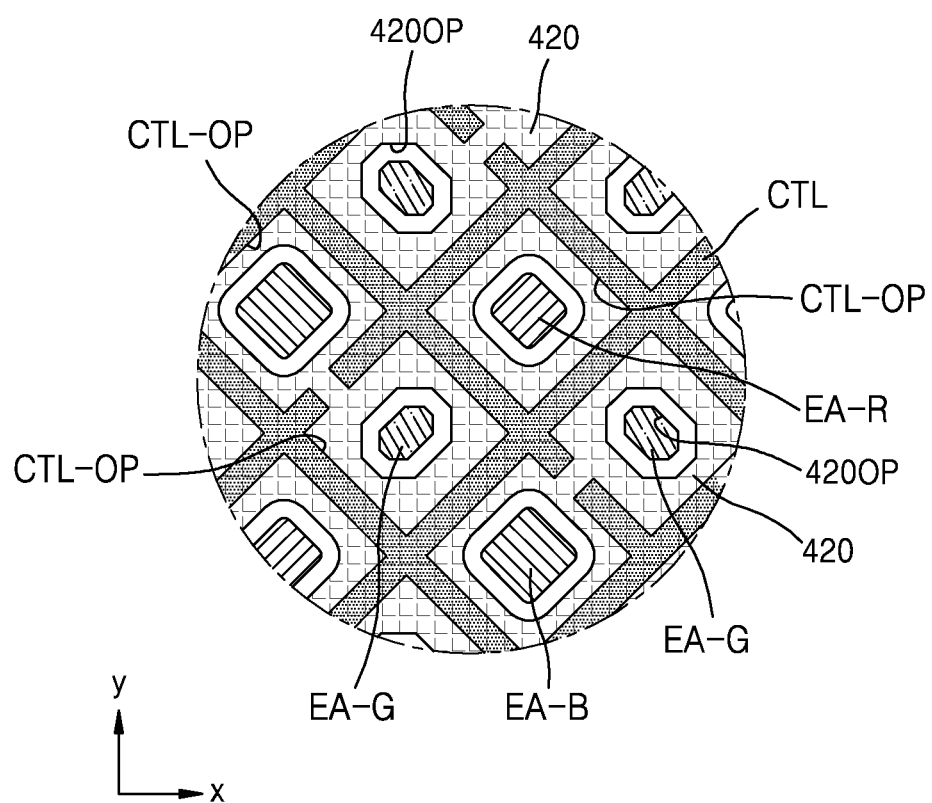

FIG. 4 is a plan view of the functional layer according to an embodiment. FIG. 4 schematically illustrates touch electrodes included in the functional layer. FIGS. 5A and 5B are plan views of the functional layer according to an embodiment, and are each an enlarged plan view of portion V of FIG. 4.

Referring to FIG. 4, the functional layer 400 may include first sensing electrodes SP1 arranged along a first direction (for example, x direction), and second sensing electrodes SP2 arranged along a second direction (for example, y direction). The first direction and the second direction may intersect with each other (for example, vertically intersect). The neighboring first sensing electrodes SP1 may be electrically connected to each other through first connection electrodes CP1, and the neighboring second sensing electrodes SP2 may be electrically connected to each other through second connection electrodes CP2.

The first sensing electrodes SP1 and the second sensing electrodes SP2 may each include a conductive layer. The conductive layer may include a metal layer or a transparent conductive layer. The metal layer may include molybdenum (Mo), mendelevium (Mb), silver (Ag), titanium (Ti), copper (Cu), aluminum (Al), and any alloy thereof. The transparent conductive layer may include a transparent conductive oxide such as indium tin oxide (ITO), indium zinc oxide (IZO), zinc oxide (ZnO), indium tin zinc oxide (ITZO), or a combination thereof. The transparent conductive layer may include a conductive polymer such as poly(3,4-ethylendioxythiophene (PEDOT), metal nanowires, carbon nanotubes, graphene, or a combination thereof. The first connection electrodes CP1 and the second connection electrodes CP2 may each include a conductive layer such as a metal layer or a transparent conductive layer as described above.

The sensing electrodes and the connection electrodes may each have a mesh structure including openings. For example, as illustrated in FIGS. 5A and 5B, each of the first sensing electrodes SP1 may be formed in a conductive layer CTL. The conductive layer CTL may include openings CTL-OP and body portions. The body portions may at least partially surround the openings CTL-OP and define the openings CTL-OP. The body portions may be connected to each other to form a mesh structure. Similarly, each of the second sensing electrodes SP2, each of the first connection electrodes CP1, and each of the second connection electrodes CP2 may also have a mesh structure.

The respective openings CTL-OP of the conductive layer CTL may overlap emission areas of the pixels. For example, each of the openings CTL-OP may be disposed to overlap an emission area EA-R from which red light may be emitted, an emission area EA-G from which green light may be emitted, or an emission area EA-B from which blue light may be emitted. For example, the emission areas EA-R, EA-G, EA-B may emit light due to openings CTL-OP.

As illustrated in FIG. 5A, the openings CTL-OP may be substantially or entirely surrounded by the body portions of the conductive layer CTL so as not to be spatially connected to each other. As another example, at least one of the openings CTL-OP may be partially surrounded by the body portion of the conductive layer CTL. For example, as illustrated in FIG. 5B, the neighboring openings CTL-OP may be spatially connected to each other.

The functional layer 400 may include a first insulating layer 420 disposed above and/or below the conductive layer CTL, and FIGS. 5A and 5B illustrate the first insulating layer 420 overlapping the conductive layer CTL. The first insulating layer 420 may include first openings 420OP corresponding to the emission areas. The first openings 420OP of the first insulating layer 420 may be formed by removing portions of the first insulating layer 420 through an exposure process and a development process. The first openings 420OP may pass through the top surface and the bottom surface of the first insulating layer 420. Viewed in a plan view, the first openings 420OP may have a shape that may be the same as or similar to that of the respective emission areas. For example, the red and blue emission areas EA-R and EA-B and the first openings 420OP corresponding thereto may have a rectangular (for example, substantially rectangular) shape. The green emission areas EA-G and the first openings 420OP corresponding thereto may have a shape similar to each other, such as a hexagonal or octagonal shape. The term "corresponding" as used herein may mean "overlapping". In another embodiment, viewed in a plan view, the first openings 420OP may have a shape different from that of the respective emission areas. For example, while the red, blue, and green emission areas EA-R, EA-B, and EA-G have a polygonal shape, the first openings 420OP may have a different shape, such as a circular shape.

Figure 6:
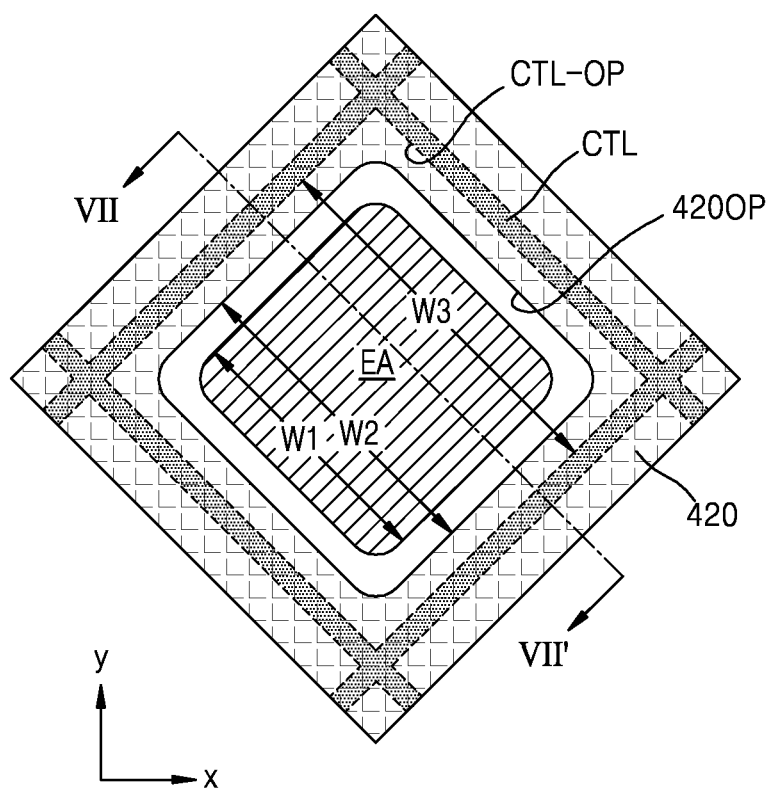
FIG. 6 is a plan view illustrating a pixel of a display apparatus, according to an embodiment.
Figure 7:
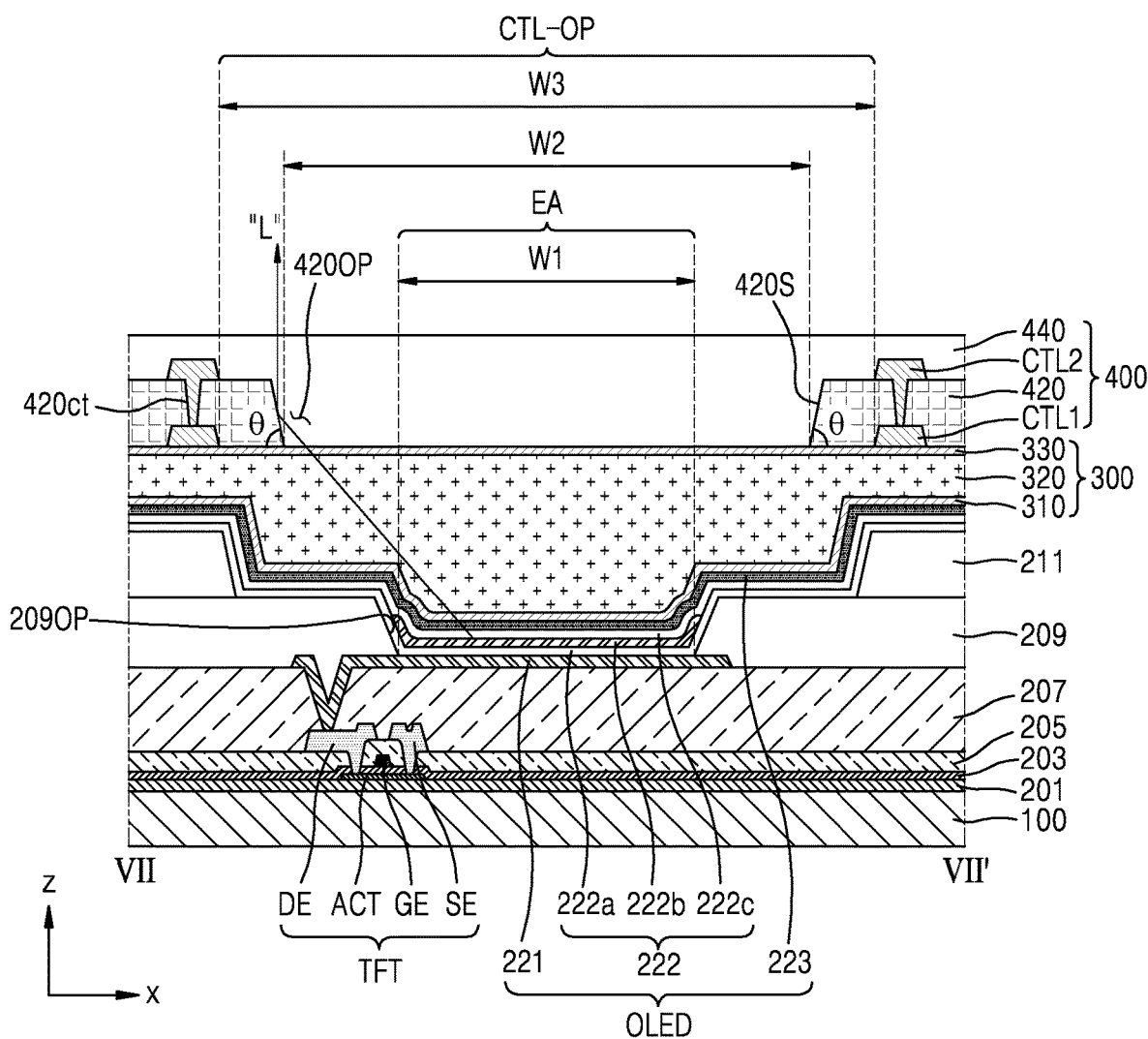
FIG. 7 is a schematic cross-sectional view illustrating the pixel of the display apparatus according to an embodiment.

FIG. 6 is a plan view illustrating one pixel of the display apparatus, according to an embodiment, and FIG. 7 is a schematic cross-sectional view illustrating one pixel of the display apparatus, according to an embodiment, and corresponds to a cross section taken along line VII-VII' of FIG. 6.

Referring to FIG. 6, the opening CTL-OP of the conductive layer CTL, the first opening 420OP of the first insulating layer 420, and the emission area EA may overlap each other. A size of the opening CTL-OP of the conductive layer CTL may be greater than a size of the first opening 420OP of the first insulating layer 420. A size of the first opening 420OP of the first insulating layer 420 may be greater than a size of the emission area EA. For example, a first width W1 of the emission area EA may be smaller than a second width W2 of the first opening 420OP of the first insulating layer 420, and a second width W2 of the emission area EA may be smaller than a third width W3 of the opening CTL-OP of the conductive layer CTL.

The body portion of the conductive layer CTL may overlap the first insulating layer 420. For example, the body portion of the conductive layer CTL may overlap the body portion of the first insulating layer 420. The conductive layer CTL may include sub-layers. As one embodiment, FIG. 7 illustrates an example in which the conductive layer CTL may include a first sub-conductive layer CTL1 and a second sub-conductive layer CTL2.

The first sub-conductive layer CTL1 may be disposed below the first insulating layer 420. The second sub-conductive layer CTL2 may be disposed above the first insulating layer 420. The first insulating layer 420 may be interposed between the first sub-conductive layer CTL1 and the second sub-conductive layer CTL2. The substrate 100, the display layer including the OLED, and the encapsulation layer 300 may be disposed below the first sub-conductive layer CTL1 and the second sub-conductive layer CTL2.

Referring to FIG. 7, the substrate 100 may be a single layer of a glass material. As another example, the substrate 100 may include a polymer resin. In case that the substrate 100 includes the polymer resin, the substrate 100 may have a structure in which a layer including a polymer resin and an inorganic layer may be stacked. Examples of the polymer resin may include polyethersulfone (PES), polyacrylate, polyetherimide (PEI), polyethyelene napthalate (PEN), polyethyeleneterepthalate (PET), polyphenylene sulfide (PPS), polyarylate (PAR), polyimide (PI), polycarbonate (PC), cellulose acetate propionate (CAP), or the like or the combination thereof.

The TFT may include a semiconductor layer ACT, a gate electrode GE, a source electrode SE, and a drain electrode DE. The semiconductor layer ACT may include amorphous silicon, polycrystalline silicon, or an organic semiconductor material. In order to secure an electrical insulation between the semiconductor layer ACT and the gate electrode GE, a gate insulating film 203 may be disposed between the semiconductor layer ACT and the gate electrode GE. The gate insulating film 203 may include an inorganic material such as silicon oxide, silicon nitride, and/or silicon oxynitride. Also, an interlayer insulating layer 205 may be disposed above the gate electrode GE. The interlayer insulating layer 205 may include an inorganic material such as silicon oxide, silicon nitride, and/or silicon oxynitride. The source electrode SE and the drain electrode DE may be disposed above the interlayer insulating layer 205. The insulating film, which may include the inorganic material, may be formed through chemical vapor deposition (CVD) or atomic layer deposition (ALD).

The gate electrode GE, the source electrode SE, and the drain electrode DE may include conductive materials. The gate electrode GE may include molybdenum or aluminum and may have a multi-layered structure if necessary. For example, the gate electrode GE may be a single molybdenum layer, or may have a three-layer structure including a molybdenum layer, an aluminum layer, and a molybdenum layer. The source electrode SE and the drain electrode DE may include titanium or aluminum and may have a multi-layered structure if necessary. For example, the source electrode SE and the drain electrode DE may have a three-layer structure including a titanium layer, an aluminum layer, and a titanium layer.

A buffer layer 201 may be disposed between the TFT and the substrate 100. The buffer layer 201 may include an inorganic material such as silicon oxide, silicon nitride, and/or silicon oxynitride. The buffer layer 201 may increase flatness of the top surface of the substrate 100, or may prevent or reduce the permeation of impurities from the substrate 100 or the like into the semiconductor layer Act of the TFT.

A planarization insulating layer 207 may be disposed above the TFT. The planarization insulating layer 207 may include, for example, an organic material such as acryl, benzocyclobutene (BCB), hexamethyldisiloxane (HMDSO), or a combination thereof. In FIG. 7, the planarization insulating layer 207 is illustrated as a single layer, but the planarization insulating layer 207 may have a multi-layered structure in other embodiments.

Pixel electrodes 221 may be disposed above the planarization insulating layer 207. A pixel electrode 221 may be disposed for each pixel. The pixel electrodes 221 corresponding to the neighboring pixels may be spaced apart from each other.

The pixel electrode 221 may be a reflective electrode. In some embodiments, the pixel electrode 221 may include a reflective film and a transparent or semi-transparent electrode layer disposed above the reflective film. The reflective film may include Ag, Mg, Al, Pt, Pd, Au, Ni, Nd, Ir, Cr, or any compound thereof. The transparent or semi-transparent electrode layer may include at least one selected from the group consisting of indium tin oxide (ITO), indium zinc oxide (IZO), zinc oxide (ZnO), indium oxide ($In_2O_3$), indium gallium oxide (IGO), and aluminum zinc oxide (AZO). In some embodiments, the pixel electrode 221 may have a three-layer structure including an ITO layer, an Ag layer, and ITO layer.

A pixel defining layer 209 may be disposed above the pixel electrode 221. The pixel defining layer 209 may include a second opening 209OP that may expose a central portion of the pixel electrode 221. The pixel defining layer 209 may cover an edge of the pixel electrode 221 and increase a distance between the edge of the pixel electrode 221 and an opposite electrode 223, thereby preventing arc from occurring at the edge of the pixel electrode 221. The pixel defining layer 209 may include an organic insulating material such as PI, polyamide, an acryl resin, BCB, HMDSO, a phenol resin, or a combination thereof. The pixel defining layer 209 may be formed by spin coating or the like. As another example, the pixel defining layer 209 may include an inorganic insulating material. As another example, the pixel defining layer 209 may have a multi-layered structure including an inorganic insulating material and an organic insulating layer.

A spacer 211 may be disposed above the pixel defining layer 209. The spacer 211 may prevent the layers between the substrate 100 and the spacer 211 from being damaged by a mask used in a process of forming an emission layer 222b, which is further described below. The spacer 211 may include the same material as the pixel defining layer 209.

An emission layer 222b may be disposed in the second opening 209OP of the pixel defining layer 209. The emission layer 222b may be an organic material including a fluorescent or phosphorescent material capable of emitting light, for example, red light, green light, or blue light. The organic material may be a low-molecular-weight organic material or a high-molecular-weight organic material.

A first functional layer 222a may be provided. The first functional layer 222a may be disposed below the emission layer 222b. The first functional layer 222a may include, for example, a hole transport layer (HTL), or may include a hole transport layer and a hole injection layer (HIL). A second functional layer 222c may be provided. The second functional layer 222c may be disposed above the emission layer 222b, and may include an electron transport layer (ETL) and/or an electron injection layer (EIL). In some embodiments, the second functional layer 222c may not be provided.

The emission layer 222b may be disposed for each pixel so as to correspond to the second opening 209OP of the pixel defining layer 209. The first functional layer 222a and the second functional layer 222c may be a common layer integrally formed so as to substantially or entirely cover the substrate 100. For example, the first functional layer 222a and the second functional layer 222c may substantially or entirely cover the display area of the substrate 100. An opposite electrode 223 may be provided. The opposite electrode 223 may substantially or entirely cover the substrate 100.

The opposite electrode 223 may include a transparent or semitransparent layer including silver (Ag), magnesium (Mg), aluminum (Al), platinum (Pt), palladium (Pd), gold (Au), nickel (Ni), neodymium (Nd), iridium (Ir), chromium (Cr), lithium (Li), calcium (Ca), or any alloy thereof. As another example, the opposite electrode 223 may further include a layer including ITO, IZO, ZnO, $In_2O_3$, a combination there of above the transparent or semitransparent layer including the above-mentioned material. In one embodiment, the opposite electrode 223 may include silver (Ag), magnesium (Mg), or an alloy of silver (Ag) and magnesium (Mg).

The encapsulation layer 300 may include at least one inorganic encapsulation layer and at least one organic encapsulation layer. For example, as illustrated in FIG. 7, the encapsulation layer 300 may include a first inorganic encapsulation layer 310, an organic encapsulation layer 320, and a second inorganic encapsulation layer 330.

The first inorganic encapsulation layer 310 and the second inorganic encapsulation layer 330 may include at least one inorganic insulating material selected from aluminum oxide, titanium oxide, tantalum oxide, hafnium oxide, zinc oxide, silicon oxide, silicon nitride, and silicon oxynitride. The first inorganic encapsulation layer 310 and the second inorganic encapsulation layer 330 may have a single layer or a multi-layered structure including the above-mentioned inorganic insulating material.

The organic encapsulation layer 320 may alleviate internal stress of the first inorganic encapsulation layer 310 and/or the second inorganic encapsulation layer 330. The organic encapsulation layer 320 may include a polymer-based material. The polymer-based material may include polyethylene terephthalate, polyethylene naphthalate, polycarbonate, polyimide, polyethylenesulfonate, polyoxymethylene, polyarylate, hexamethyldisiloxane, acrylic resin (e.g., polymethyl methacrylate, polyacrylic acid, etc.), or any combination thereof.

The organic encapsulation layer 320 may be formed by applying a monomer having flowability and curing a monomer layer using heat or light such as ultraviolet light. As another example, the organic encapsulation layer 320 may be formed by applying the polymer-based material described above.

The functional layer 400 may be disposed above the encapsulation layer 300. The functional layer 400 may include first and second sub-conductive layers CTL1 and CTL2, a first insulating layer 420, and a second insulating layer 440. The first sub-conductive layer CTL1 may be disposed below the first insulating layer 420. The second sub-conductive layer CTL2 may be disposed above the first insulating layer 420. The first sub-conductive layer CTL1 and the second sub-conductive layer CTL2 may be connected through a contact hole 420ct formed in the first insulating layer 420. The first sensing electrode SP1 and the second sensing electrode SP2 described above with reference to FIGS. 4 through 5B may each have a two-layer structure of the first sub-conductive layer CTL1 and the second sub-conductive layer CTL2 connected through the contact hole 420ct, as illustrated in FIG. 7.

The first sub-conductive layer CTL1 and the second sub-conductive layer CTL2 may each include a metal layer or a transparent conductive layer. The metal layer may include molybdenum (Mo), mendelevium (Mb), silver (Ag), titanium (Ti), copper (Cu), aluminum (Al), and any alloy thereof. The transparent conductive layer may include a transparent conductive oxide such as ITO, IZO, ZnO, or ITZO. The transparent conductive layer may include a conductive polymer such as PEDOT, metal nanowires, carbon nanotubes, or graphene. In one embodiment, the first sub-conductive layer CTL1 and the second sub-conductive layer CTL2 may each have a three-layer structure of a titanium layer, an aluminum layer, and a titanium layer.

The first insulating layer 420 may include the first opening 420OP overlapping the emission area EA. The emission area EA may be defined by the second opening 209OP of the pixel defining layer 209. For example, a width of the second opening 209OP of the pixel defining layer 209 may be a width (first width, W1) of the emission area EA. The first opening 420OP of the first insulating layer 420 may overlap the second opening 209OP of the pixel defining layer 209, and a second width W2 of the first opening 420OP may be greater than a width (first width, W1) of the second opening 209OP of the pixel defining layer 209. The body portion of the first insulating layer 420 defining the first opening 420OP may overlap the body portion of the pixel defining layer 209. For example, the body portion of the first insulating layer 420 may overlap only the body portion of the pixel defining layer 209. The body portion of the first insulating layer 420 may be a portion distinct from the first opening 420OP of the first insulating layer 420. The body portion of the first insulating layer 420 may be a portion having a volume (for example, a predetermined volume). Similarly, the body portion of the pixel defining layer 209 may be a portion distinct from the second opening 209OP of the pixel defining layer 209 and may be a portion having a volume (for example, a predetermined volume).

The first insulating layer 420 may include a photoresist. The first insulating layer 420 may be formed by applying a photoresist on the encapsulation layer 300 as a whole and exposing and developing the photoresist.

The second insulating layer 440 may be disposed above the first insulating layer 420. A portion of the second insulating layer 440 may disposed in (or within) the first opening 420OP of the first insulating layer 420. The second insulating layer 440 may at least partially fill the first opening 420OP of the first insulating layer 420. For example, the second insulating layer 440 may fill the first opening 420OP as a whole. The second insulating layer 440 may include a flat (for example, substantially flat) upper surface, and a thickness of a portion of the second insulating layer 440 overlapping the first opening 420OP may be greater than a thickness of another portion of the second insulating layer 440 (e.g., a portion overlapping the top surface of the first insulating layer 420).

The second insulating layer 440 may be in contact with (for example, directly contact) a side surface 420S and a top surface of the first insulating layer 420 defining the first opening 420OP. Also, the second insulating layer 440 may be in contact with the encapsulation layer 300 through the first opening 420OP. As one embodiment, FIG. 7 illustrates an example in which the second insulating layer 440 may be in contact with (for example, directly contact) the second inorganic encapsulation layer 330 through the first opening 420OP.

The side surface 420S of the first insulating layer 420 may include an inclined surface. A minor angle θ (hereinafter, referred to as an inclination angle) between the top surface of the encapsulation layer 300 (e.g., the top surface of the second inorganic encapsulation layer) and the side surface 420S of the first insulating layer 420 may be at least 70 degrees. For example, the inclination angle θ may be $70 \leq \theta < 90$. As additional examples, the inclination angle θ may be $70 \leq \theta \leq 87$, $70 \leq \theta \leq 85$, $70 \leq \theta \leq 83$, or $70 \leq \theta \leq 80$.

Because the side surface 420S of the first insulating layer 420 may include an inclined surface tapered forward with respect to the top surface of the encapsulation layer 300, the width of the first opening 420OP may gradually increase as the distance from the substrate 100 increases in a direction (z direction) perpendicular to the top surface of the substrate 100. A width of the upper portion of the first opening 420OP may be greater than a width of the lower portion of the first opening 420OP, and the second width W2 of the first opening 420OP may correspond to the width of the lower portion of the first opening 420OP.

The second insulating layer 440 may protect the above-mentioned conductive layer by covering the conductive layer included in the functional layer 400. For example, the second insulating layer 440 may cover and protect the first sub-conductive layer CTL1 and the second sub-conductive layer CTL2.

The second insulating layer 440 may include a material having a refractive index greater than that of the first insulating layer 420. For example, the second insulating layer 440 may include an organic material having a high refractive index. The second insulating layer 440 may include a material that may be cured by ultraviolet (UV) light. Light "L" emitted from the OLED may be reflected from the side surface 420S of the first insulating layer 420 for improved light emission efficiency. For example, light "L" may be emitted from the OLED and travel in an oblique direction with respect to a direction (z direction) perpendicular to the top surface of the substrate 100. The light may be reflected from the side surface 420S of the first insulating layer 420 and travel outside the display apparatus, thereby improving light emission efficiency of the OLED and increasing luminance of the OLED.

In FIG. 7, an example in which the conductive layer included in the functional layer 400 includes the two-layer structure of the first and second sub-conductive layers CTL1 and CTL2 and the first and second sensing electrodes SP1 and SP2 each include the conductive layer of the above-described two-layer structure has been described, but the disclosure is not limited thereto. The functional layer 400 may include a conductive layer that may be single-body (single layer structure) and may be disposed below or above the first insulating layer 420, and the first and second sensing electrodes SP1 and SP2 may each include a single-body conductive layer.

Figure 8:
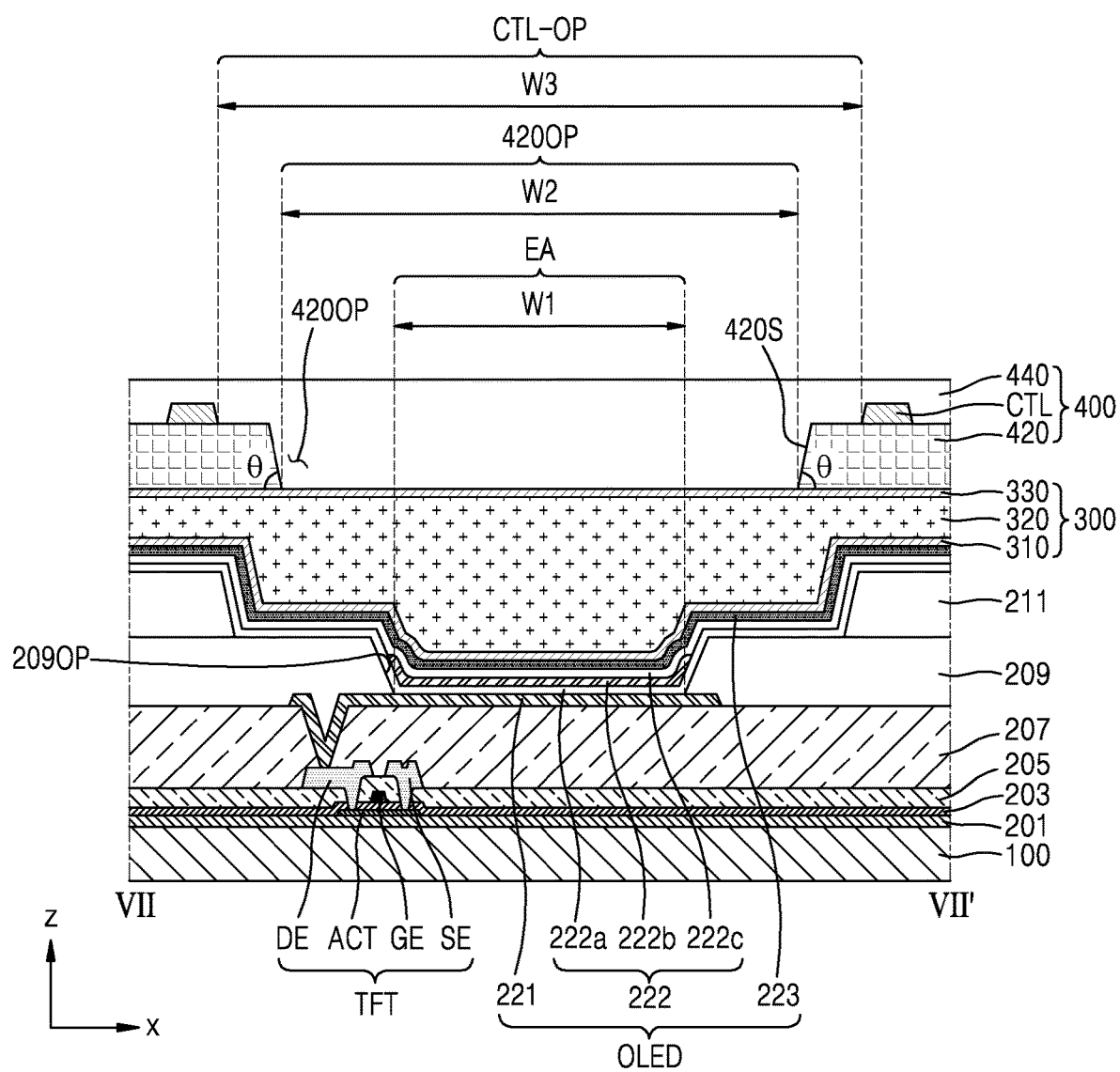
FIG. 8 is a schematic cross-sectional view of a display apparatus according to an embodiment.
Figure 9:
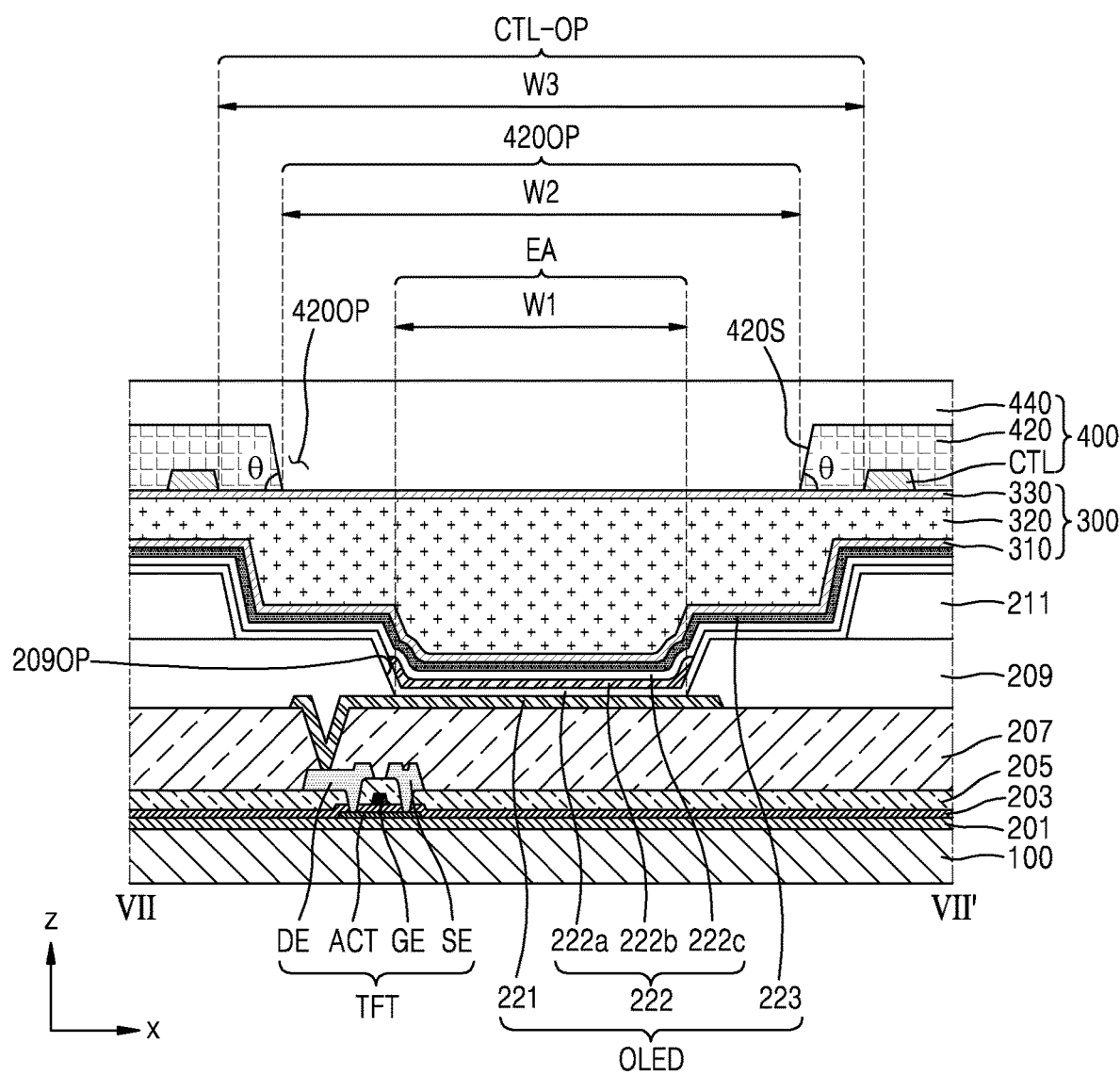
FIG. 9 is a schematic cross-sectional view of a display apparatus according to an embodiment.
Figure 10:
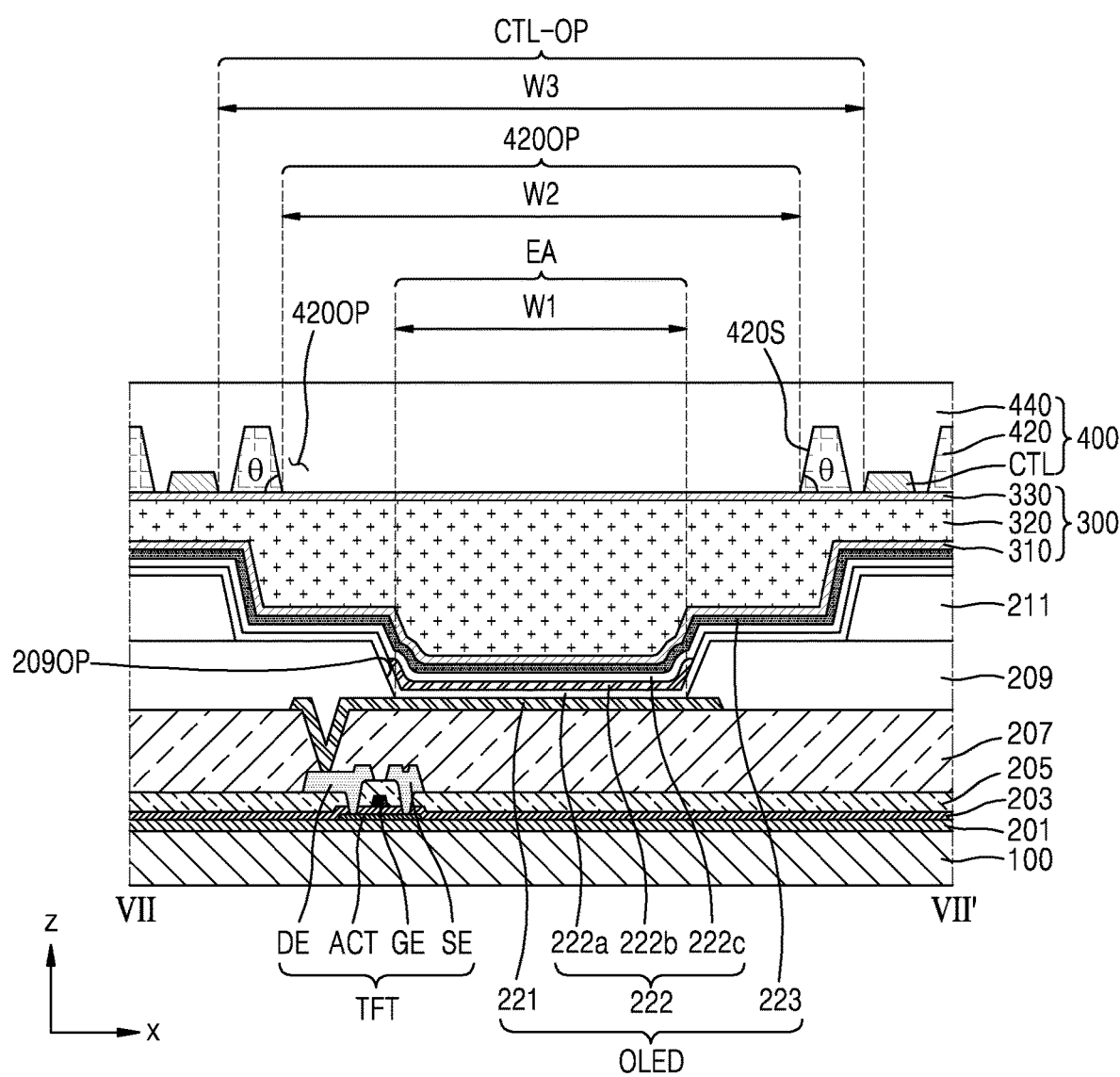
FIG. 10 is a schematic cross-sectional view of a display apparatus according to an embodiment.

FIGS. 8 to 10 are schematic cross-sectional views of display apparatuses according to another embodiment. Referring to the display apparatuses of FIGS. 8 to 10, because structures from a substrate 100 to an encapsulation layer 300 may be the same as those described above with reference to FIG. 7, the following description will focus on structures of a functional layer 400.

Referring to FIGS. 8 to 10, the functional layer 400 may include a single-body conductive layer CTL. A conductive layer CTL may be disposed above a first insulating layer 420, for example, between the first insulating layer 420 and a second insulating layer 440 (FIG. 8). As another example, the conductive layer CTL may be disposed below the first insulating layer 420. For example, as illustrated in FIG. 9, a conductive layer CTL may be disposed between an encapsulation layer 300 and a first insulating layer 420 so as to be covered with the first insulating layer 420. As another example, as illustrated in FIG. 10, a conductive layer CTL may be disposed above an encapsulation layer 300, but may not be covered with a first insulating layer 420. Other features except for the position of the conductive layer CTL in the functional layer 400 may be the same as those described above with reference to FIG. 7.

Figure 11:
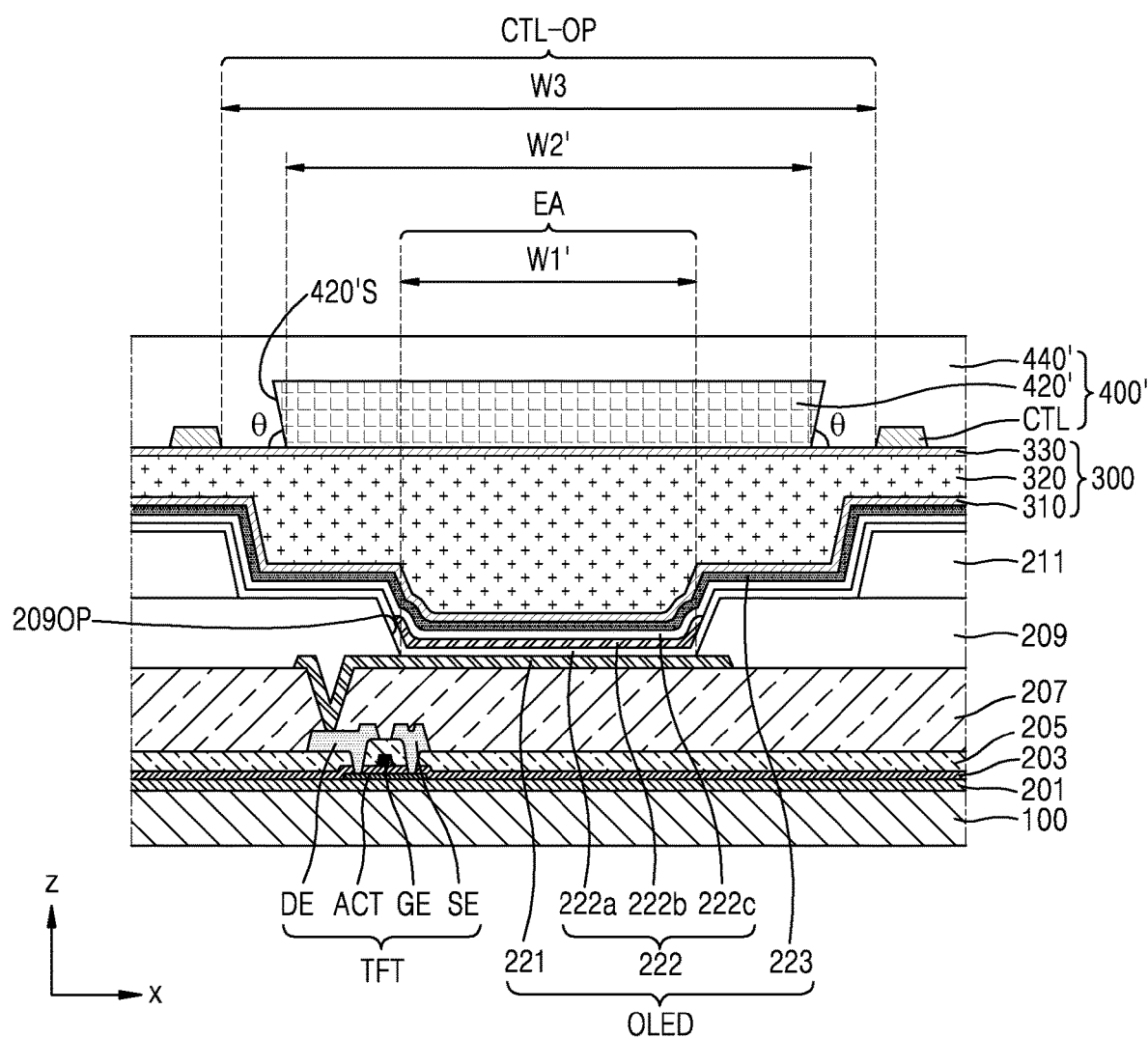
FIG. 11 is a schematic cross-sectional view of a display apparatus according to an embodiment.
Figure 12:
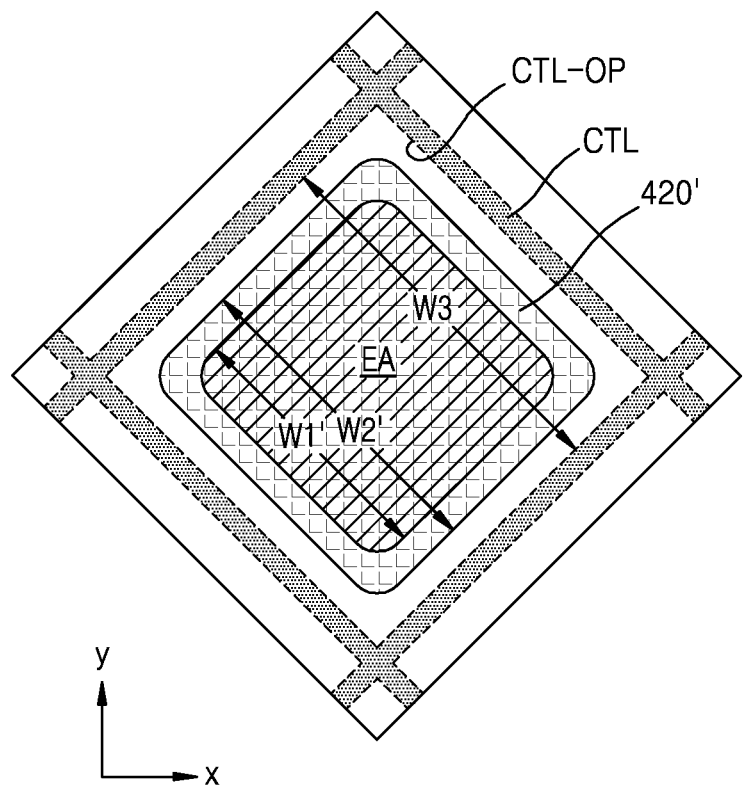
FIG. 12 is a plan view of the display apparatus of FIG. 11.

FIG. 11 is a schematic cross-sectional view of a display apparatus according to another embodiment, and FIG. 12 is a plan view of the display apparatus of FIG. 11.

Because structures from a substrate 100 to an encapsulation layer 300 in the display apparatus of FIG. 11 may be the same as those described above with reference to FIG. 7, the following description will focus on a functional layer 400'.

The functional layer 400' may include a conductive layer CTL, a first insulating layer 420', and a second insulating layer 440'. The first insulating layer 420' may be in contact with a top surface of an encapsulation layer 300, for example, a top surface of a second inorganic encapsulation layer 330.

The first insulating layer 420' may overlap and/or cover an emission area EA as illustrated in FIGS. 11 and 12. The first insulating layer 420' may be disposed corresponding to the emission area EA of each pixel. For example, the first insulating layers 420' disposed in the neighboring emission areas EA may be spaced apart from each other. In other words, a body portion of the first insulating layer 420' may be positioned to overlap the emission area EA of each pixel, and a removal portion (or an opening portion) formed by removing a portion of the first insulating layer 420' may be positioned between the body portions disposed in the neighboring pixels. A central portion of the first insulating layer 420' may overlap the emission area EA or the opening 209OP of the pixel defining layer 209. A periphery portion of the first insulating layer 420' may overlap the pixel defining layer 209.

Although the first insulating layer 420 described above with reference to FIG. 7 may be disposed to overlap the pixel defining layer 209 and has a trapezoidal cross section with a forward tapered side surface 420S, the first insulating layer 420' illustrated in FIG. 11 may be disposed to overlap the emission area EA and may have an inverted trapezoidal cross section with a reverse-tapered side surface 420'S.

The side surface 420'S of the first insulating layer 420' may include an inclined surface that may be reverse-tapered along the inclined surface, for example, in a direction away from the encapsulation layer 300. A minor angle θ (hereinafter, referred to as an inclination angle) between the top surface of the encapsulation layer 300 (e.g., the top surface of the second inorganic encapsulation layer) and the side surface 420'S of the first insulating layer 420' may be at least 70 degrees. For example, the inclination angle θ may be 70≤θ<90. As additional examples, the inclination angle θ may be 70≤θ≤87, 70≤θ≤85, 70≤θ≤83, or 70≤θ≤80.

A width W2' of the first insulating layer 420' may be greater than a first width W1' of the emission area EA. As described above, the first width W1' of the emission area EA may correspond to the width of the second opening 209OP of the pixel defining layer 209. Because the side surface 420'S of the first insulating layer 420' may include the reverse-tapered inclined surface, the width of the first insulating layer 420', for example, the body portion of the first insulating layer 420', may gradually increase as the distance from the substrate 100 increases in a direction (z direction) perpendicular to the top surface of the substrate 100. The width W2' of the first insulating layer 420' may correspond to the width of the lower portion of the first insulating layer 420'. As described above with reference to FIGS. 5A and 5B, the conductive layer CTL may include the opening CTL-OP, and the third width W3 of the opening CTL-OP may be greater than the width W2' of the first insulating layer 420'.

The first insulating layer 420' may be formed through an exposure and development process and may include a photoresist. The first insulating layer 420' may be covered with the second insulating layer 440', and the second insulating layer 440' may be in contact with the side surface 420'S and the top surface of the first insulating layer 420'.

The second insulating layer 440' may include a material having a refractive index lower than that of the first insulating layer 420', for example, an organic material having a low refractive index. Light, which may be emitted from the OLED and travel in an oblique direction with respect to a direction (z direction) perpendicular to the top surface of the substrate 100, may be reflected from the side surface 420'S of the first insulating layer 420' and travel outside the display apparatus, thereby improving light emission efficiency of the OLED and increasing luminance of the OLED.

Figure 13:
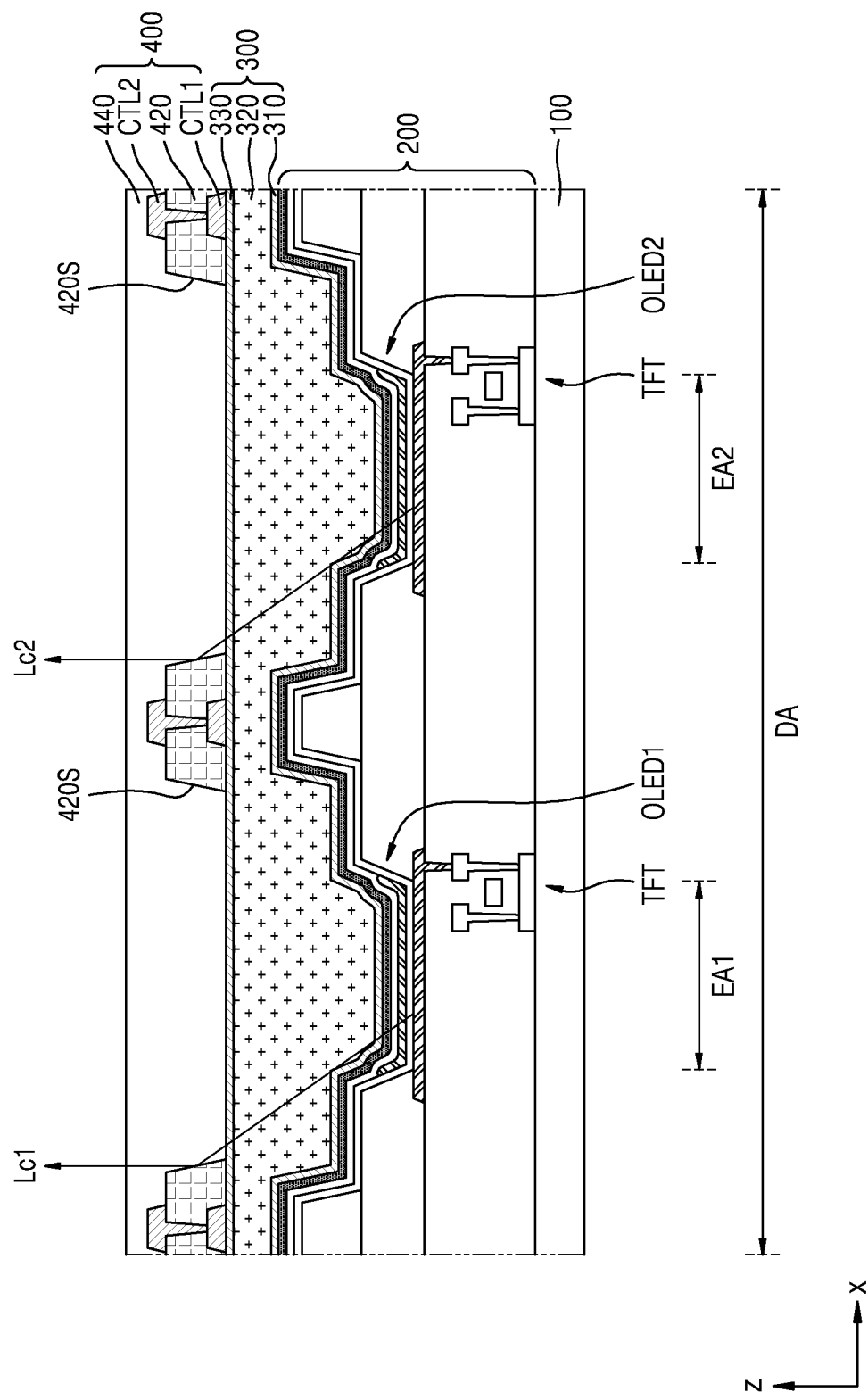
FIG. 13 is a schematic cross-sectional view schematically illustrating a display apparatus according to an embodiment.

FIG. 13 is a cross-sectional view schematically illustrating a display apparatus according to an embodiment.

In a display area DA, display elements may be disposed for each pixel. For example, as illustrated in FIG. 13, a display layer 200 on a substrate 100 may include a first OLED OLED1 and a second OLED OLED2. The first OLED OLED1 and the second OLED OLED2 may be electrically connected to TFTs, respectively. The structure of the display layer 200 may be the same as that described above with reference to FIG. 7.

The first OLED OLED1 may emit first color light, and the second OLED OLED2 may emit second color light. First color light Lc1 may be emitted from the first emission area EA1 and second color light Lc2 may be emitted from the second emission area EA2. First color light Lc1 and second color light Lc2 may be reflected from the side surface 420S of the first insulating layer 420 and travel outside the display apparatus. The first color and the second color may be different colors.

FIG. 13 illustrates an example in which the functional layer 400 may have the structure described with reference to FIG. 7, but the disclosure is not limited thereto. In another embodiment, the functional layer 400 may have the structure according to one of the embodiments described with reference to FIGS. 8 to 10, the embodiment described with reference to FIG. 11, or embodiments derived from the above-described embodiments.

Figure 14:
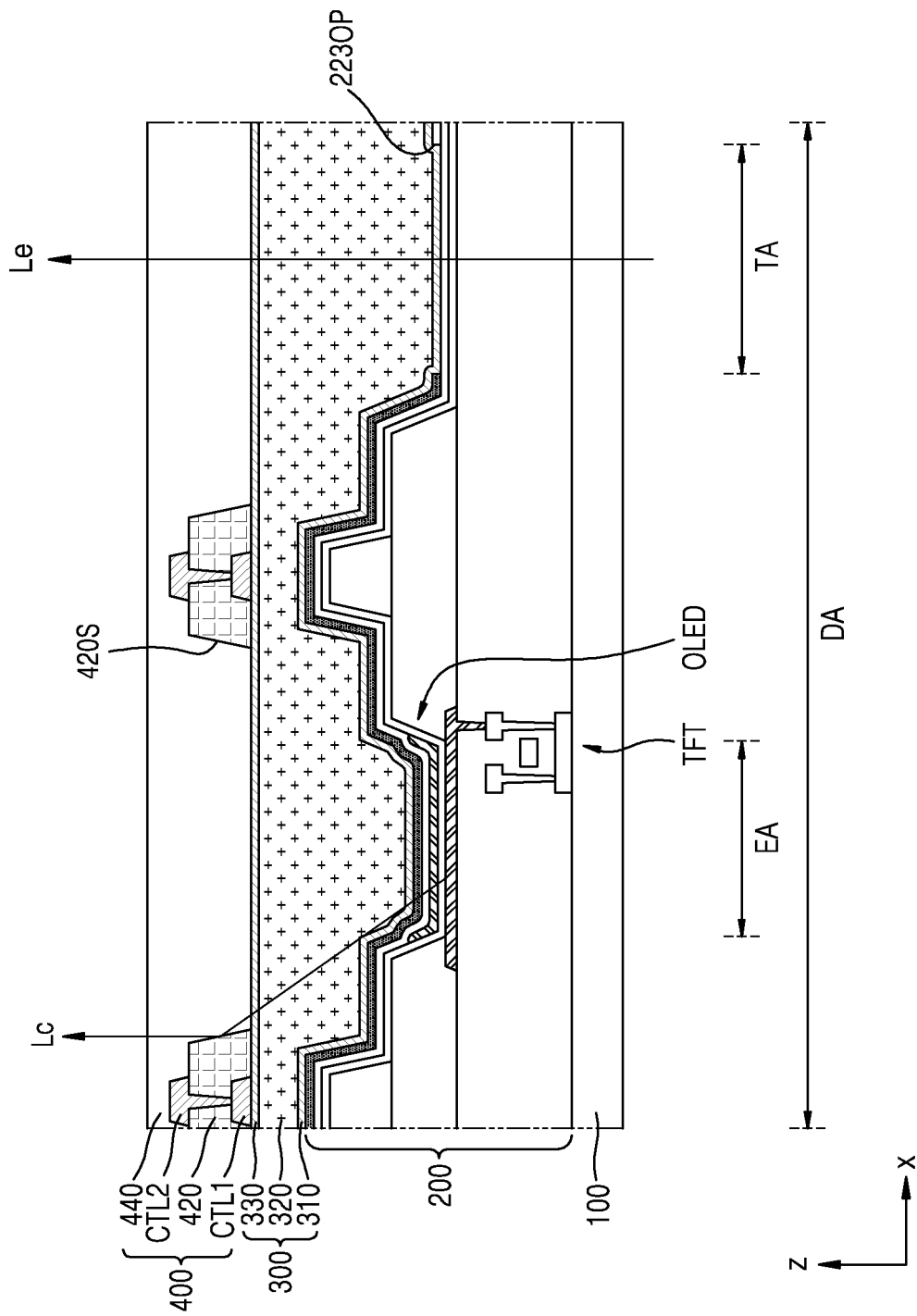
FIG. 14 is a schematic cross-sectional view schematically illustrating a display apparatus according to an embodiment.

FIG. 14 is a cross-sectional view schematically illustrating a display apparatus according to an embodiment.

Referring to FIG. 14, a display area DA may include a transmission area TA and emission areas EA that may emit color light. As described above, light emission efficiency of light Lc emitted from an OLED disposed corresponding to the emission area EA may be improved through a structure of a first insulating layer 420 and a second insulating layer 440 that may be provided in a functional layer 400.

The transmission area TA may be an area in which external light Le that may not be generated in the display apparatus travels while passing through the display apparatus along a direction toward the functional layer 400 from the rear surface of the substrate 100 (or along an opposite direction). In order to improve the transmittance of the transmission area TA, a portion corresponding to the transmission area TA in at least one of the layers included in the display layer 200 may be removed. For example, an opposite electrode 223 may include an opening 2230P disposed in the transmission area TA, thereby improving transmittance in the transmission area TA.

Because a display element such as an OLED is not disposed in the transmission area TA, the structure for improving light emission efficiency of light emitted from the OLED, for example, the structure of the first insulating layer 420 having the inclined side surface 420S may not be disposed in the transmission area TA.

FIG. 14 illustrates an example in which the functional layer 400 may have the structure described with reference to FIG. 7, but the disclosure is not limited thereto. In another embodiment, the functional layer 400 may have the structure according to one of the embodiments described with reference to FIGS. 8 to 10, the embodiment described with reference to FIG. 11, or embodiments derived from the above-described embodiments.

The embodiments may be advantageous. According to one or more embodiments, because the first and second insulating layers of the functional layer are disposed above the encapsulation layer, a number of layers may be reduced, thereby simplifying a process of manufacture. The reduction in the number of layers may make it possible to improve optical performance increasing light emitted from the display element visible to an external user. For example, embodiments may improve transmittance of the display apparatus itself. Furthermore, because a functional layer may be provided having a function of sensing touch input and a function of improving optical performance, manufacturing efficiency and costs may be reduced.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:

1. A display apparatus comprising:
a substrate;
a display element disposed above the substrate, the display element being in a display area;
an encapsulation layer disposed above the display element and comprising an inorganic encapsulation layer and an organic encapsulation layer; and
a touch-sensing layer disposed above the encapsulation layer,
wherein the touch-sensing layer comprises:
a first insulating layer disposed above the encapsulation layer, a portion of the first insulating layer comprising a side surface inclined with respect to a top surface of the encapsulation layer and comprising an organic material, wherein the inclined side surface is in the display area;
a conductive layer comprising sensing electrodes; and
a second insulating layer covering the conductive layer and
including a refractive index different from that of the first insulating layer.

2. The display apparatus of claim 1, wherein
at least a portion of the first insulating layer contacts the top surface of the encapsulation layer.

3. The display apparatus of claim 2, wherein the encapsulation layer comprises:
a first inorganic encapsulation layer;
an organic encapsulation layer; and
a second inorganic encapsulation layer,
wherein
the first inorganic encapsulation layer, the organic encapsulation layer, and the second inorganic encapsulation layer are stacked on each other, and
a portion of the first insulating layer contacts the second inorganic encapsulation layer.

4. The display apparatus of claim 1, wherein
the first insulating layer comprises a photoresist.

5. The display apparatus of claim 1, wherein
the first insulating layer comprises a first opening defined by the side surface thereof and overlapping an emission area of the display element, and
the second insulating layer at least partially fills the first opening of the first insulating layer.

6. The display apparatus of claim 5, wherein
a refractive index of the second insulating layer is greater than a refractive index of the first insulating layer.

7. The display apparatus of claim 5, wherein the display element comprises:
a pixel electrode;
a pixel defining layer covering an edge of the pixel electrode and comprising a second opening overlapping the pixel electrode;
an emission layer disposed at the second opening; and
an opposite electrode covering the emission layer,
wherein a body portion of the first insulating layer overlaps the pixel defining layer.

8. The display apparatus of claim 7, wherein
a width of the first opening of the first insulating layer is greater than a width of the second opening of the pixel defining layer.

9. The display apparatus of claim 1, wherein
the first insulating layer overlaps an emission area of the display element and has a width greater than that of the emission area.

10. The display apparatus of claim 9, wherein
the side surface of the first insulating layer comprises an inclined surface reverse-tapered in a direction away from the encapsulation layer.

11. The display apparatus of claim 9, wherein the display element comprises:
a pixel electrode;
a pixel defining layer covering an edge of the pixel electrode and comprising a second opening overlapping the pixel electrode;
an emission layer overlapping the second opening; and
an opposite electrode covering the emission layer, wherein
a central portion of the first insulating layer overlaps the second opening of the pixel defining layer, and
a periphery portion of the first insulating layer overlaps the pixel defining layer.

12. The display apparatus of claim 9, wherein
a refractive index of the first insulating layer is greater than a refractive index of the second insulating layer.

13. The display apparatus of claim 1, wherein the inclination angle θ of the inclined surface is less than 90 degrees and greater than or equal to 70 degrees.

14. The display apparatus of claim 1, wherein the inclined side surface of the first insulating layer surrounds an emission area of the display element.

15. A display apparatus comprising:
a substrate;
a pixel electrode disposed above the substrate, the pixel electrode being in a display area;
a pixel defining layer comprising an opening overlapping the pixel electrode and defining an emission area;
an emission layer disposed in the opening;
an opposite electrode disposed above the emission layer;
an encapsulation layer disposed above the opposite electrode and comprising an inorganic encapsulation layer and an organic encapsulation layer;
a conductive layer disposed above the encapsulation layer and comprising a sensing electrode;
a first organic insulating layer disposed above the encapsulation layer, a portion of the first insulating layer comprising a side surface inclined with respect to a top surface of the encapsulation layer, wherein the inclined side surface is in the display area and surrounds the opening of the pixel defining layer in a plan view; and
a second organic insulating layer covering the first organic insulating layer and the conductive layer and including a refractive index different from that of the first organic insulating layer.

16. The display apparatus of claim 15, wherein
the first organic insulating layer comprises a photoresist.

17. The display apparatus of claim 15, wherein the encapsulation layer comprises;
a first inorganic encapsulation layer;
an organic encapsulation layer; and
a second inorganic encapsulation layer, wherein
the first inorganic encapsulation layer, the organic encapsulation layer, and the second inorganic encapsulation layer are stacked on each other, and
a portion of the first organic insulating layer contacts the second inorganic encapsulation layer.

18. The display apparatus of claim 15, wherein the first organic insulating layer comprises:
a first opening overlapping the opening of the pixel defining layer; and
a body portion overlapping a body portion of the pixel defining layer.

19. The display apparatus of claim 18, wherein
a width of the first opening of the first organic insulating layer is greater than a width of the opening of the pixel defining layer.

20. The display apparatus of claim 18, wherein
the second organic insulating layer at least partially fills the first opening, and
a refractive index of the second organic insulating layer is greater than a refractive index of the first organic insulating layer.

21. The display apparatus of claim 15, wherein
the first organic insulating layer comprises a body portion overlapping the opening of the pixel defining layer,
the side surface of the first organic insulating layer comprises an inclined surface reverse-tapered in a direction away from the encapsulation layer, and
a refractive index of the second organic insulating layer is less than a refractive index of the first organic insulating layer.

22. The display apparatus of claim 15, wherein
a periphery portion of the first organic insulating layer overlaps a portion of a body portion of the pixel defining layer.

* * * * *